United States Patent [19]

Matsui

[11] Patent Number: 5,424,987
[45] Date of Patent: Jun. 13, 1995

[54] SEMICONDUCTOR MEMORY DEVICE HAVING REDUNDANT MEMORY CELLS AND CIRCUIT THEREFOR

[75] Inventor: Yoshinori Matsui, Tokyo, Japan

[73] Assignee: NEC Corporation, Tokyo, Japan

[21] Appl. No.: 128,237

[22] Filed: Sep. 29, 1993

[30] Foreign Application Priority Data

Sep. 29, 1992 [JP] Japan .................... 4-260049

[51] Int. Cl.⁶ .............................. G11C 7/00
[52] U.S. Cl. .................. 365/200; 365/189.04; 371/10.3
[58] Field of Search .......... 365/200, 201, 203, 189.04, 365/203

[56] References Cited

U.S. PATENT DOCUMENTS

| | | | |
|---|---|---|---|
| 4,601,019 | 7/1986 | Shah et al. | 365/200 |
| 4,603,404 | 7/1986 | Yamauchi | 365/200 |
| 4,691,300 | 9/1987 | Pelley | 365/200 |
| 4,829,480 | 5/1989 | Seo | 365/200 |
| 4,833,652 | 5/1989 | Isobe | 365/200 X |
| 4,914,632 | 4/1990 | Fujishima | 365/200 |
| 5,021,944 | 6/1991 | Sasaki et al. | 365/200 |
| 5,083,294 | 1/1992 | Okajima | 365/200 |
| 5,113,374 | 5/1992 | Matsui | 365/203 X |
| 5,134,585 | 7/1992 | Murakami | 365/200 |
| 5,293,348 | 3/1994 | Abe | 365/200 X |

FOREIGN PATENT DOCUMENTS 2239534  7/1991  United Kingdom .

Primary Examiner—Joseph A. Popek
Assistant Examiner—Son Mai
Attorney, Agent, or Firm—Sughrue, Mion, Zinn, Macpeak & Seas

[57] ABSTRACT

The semiconductor memory device includes at least one pair of redundant digit lines (RD,RDb), first input-/output lines (IO,IOb) connected to a pair of digit lines (D,Db) via a respective sense amplifier (SA) and a switch (SW), second input/output lines (IO',IOb')connected to the redundant digit line pair (RD,RDb) via a sense amplifier (RSA) and switch (RSW), and selective amplifier means (IOSW, IOSW', RIOSW, RIOSW') for amplifying second input/output lines when redundant digit lines are selected.

With this configuration, even when the redundant digit line pair is substituted for the digit line pair, it is possible to execute the redundancy operation by mere translation between these input/output line pairs.

8 Claims, 4 Drawing Sheets

SEMICONDUCTOR MEMORY DEVICE HAVING REDUNDANT MEMORY CELLS AND CIRCUIT THEREFOR

BACKGROUND OF THE INVENTION

1. Field of the Invention

This invention relates to a semiconductor memory device, and more particularly to a semiconductor memory device having a digit line redundancy circuit.

2. Description of the Related Art

In a conventional semiconductor memory there may be found a digit line redundancy circuit having a digit line substitution address programming circuit. In such a semiconductor memory, redundant digit lines are used instead of the digit lines corresponding to input column addresses when the address programming circuit generates a redundancy signal. The digit line substitution address programming circuit is programmed by melting a fuse corresponding to the address of a defective digit line, discovered by electrical, laser irradiation or other types of inspection.

The operation of a conventional semiconductor memory device with a digit line redundancy circuit is as follows. First, the digit line substitution address programming circuit generates a redundancy signal when an input column address corresponds to the address of a defective digit line. In response to this redundancy signal, an enable signal for a column decoder goes to an inactive state, and a redundant digit line selection signal is activated. Since the enable signal for the column decoder is in an inactive state at this time, digit line selection signals all go to the inactive state, so that the input/output (IO) lines and the digit lines corresponding to the input column address are not connected. Accordingly, only the redundant digit lines are connected to the IO lines for a data write/read operation.

However, in the conventional digit line redundancy circuit mode, where selection is made between connecting the digit lines or the redundant digit lines to the same IO lines, there is a possibility of generating a multiple selected state in which the digit lines and the redundant digit lines are connected simultaneously to identical IO lines. That is, a redundant digit line selection signal is activated in response to the redundancy signal generated by the digit line substitution address programming circuit, but at the same time the enable signal for the column decoder starts to go to the inactive state, namely, the generation of the digit line selection signal of the column decoder begins to be inhibited. Accordingly, since the time of activation of the redundant digit line selection signal is simultaneous with the time of inactivation of the enable signal for the column decoder, there is a possibility of an instantaneous occurrence, at this time, of a multiple selected state in which the digit line selection signal and the redundant digit line selection signal are simultaneously in the active state. When the multiple selected state occurs, data on the IO lines become erroneous, and therefore the memory malfunctions.

Further, let us consider what happens when the selected state of the redundant digit lines goes to the selected state of the normal bit lines. The circuit which judges that the normal digit lines are selected with a change in column addresses is also the digit line substitution address programming circuit. It is this circuit which changes the redundancy signal from the active state to the inactive state in response to the input column addresses. In response to this change, the enable signal for the column decoder goes from the inactive state to the active state, causing the column decoder to operate. In other words, in the operation of returning to the normal digit lines, the column decoder is operated only after the change in the redundancy signal so that there is a problem that the activation and the operation of the column decoder are delayed.

BRIEF SUMMARY OF THE INVENTION

1. Objects of the Invention

It is therefore an object of the invention to provide a semiconductor memory device which can prevent the occurrence of multiple, simultaneous selections of the digit lines and the redundant digit lines on the same IO lines.

It is another object of this invention to provide a semiconductor memory device which can realize high speed operation.

2. Summary of the Invention

The semiconductor memory device according to this invention comprises a decoder circuit which generates a digit line selection signal for selecting predetermined digit lines in response to input addresses, a discrimination circuit which discriminates whether redundant digit lines are to be selected based on the input addresses, a circuit for generating a redundant digit line selection signal which selects redundant digit lines in response to the discrimination signal of the discrimination circuit, first IO lines connected respectively to a digit line group via a switch whose activation is controlled in response to the digit line selection signal, second IO lines connected to the redundant digit lines via a switch whose activation is controlled in response to the redundant digit line selection signal, and selective amplifier means which selectively amplifies the second IO lines in response to the discrimination signal.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
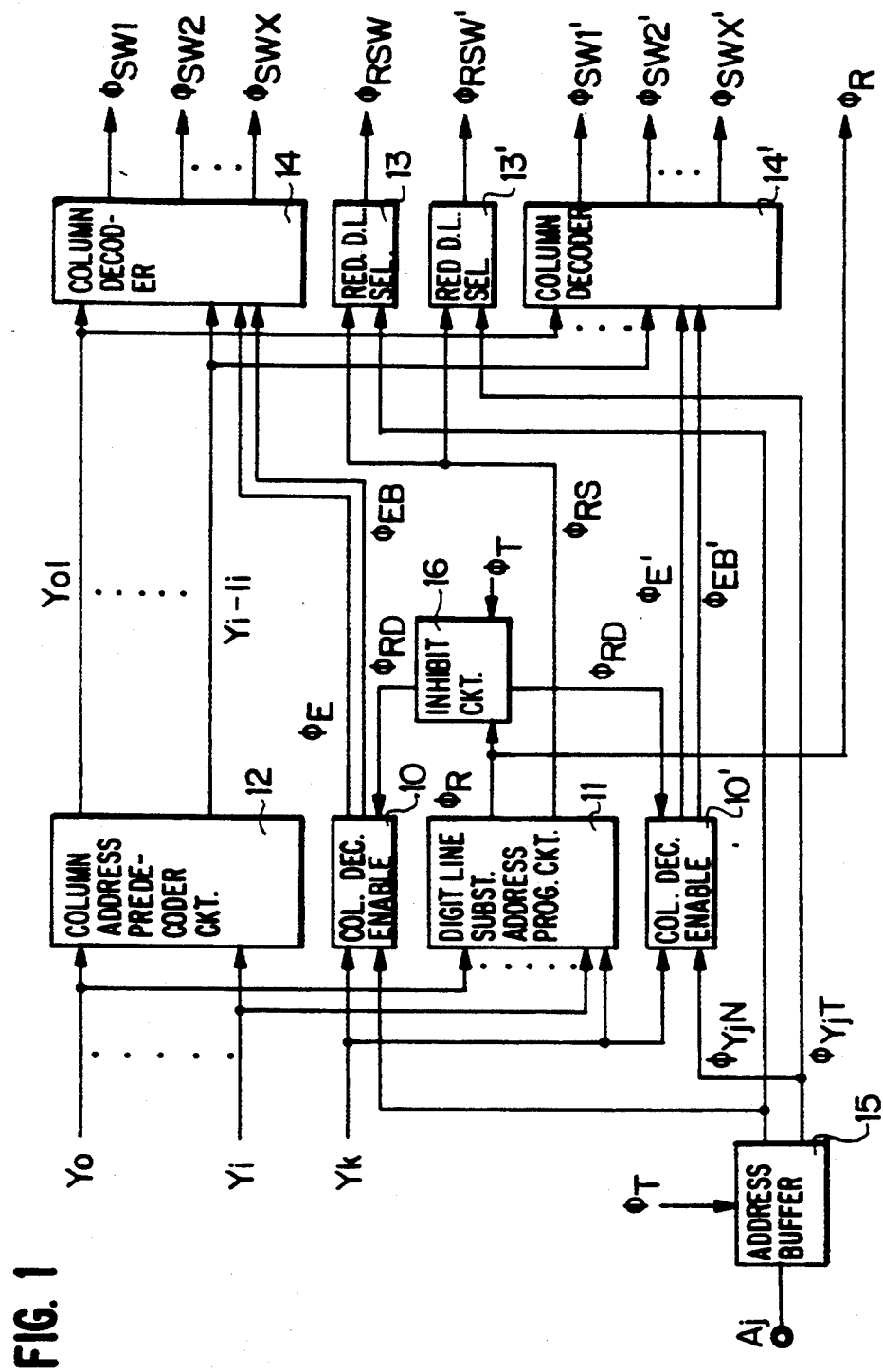
FIG. 1 is a circuit diagram for the semiconductor memory device which is a first embodiment of the invention.
Figure 2:
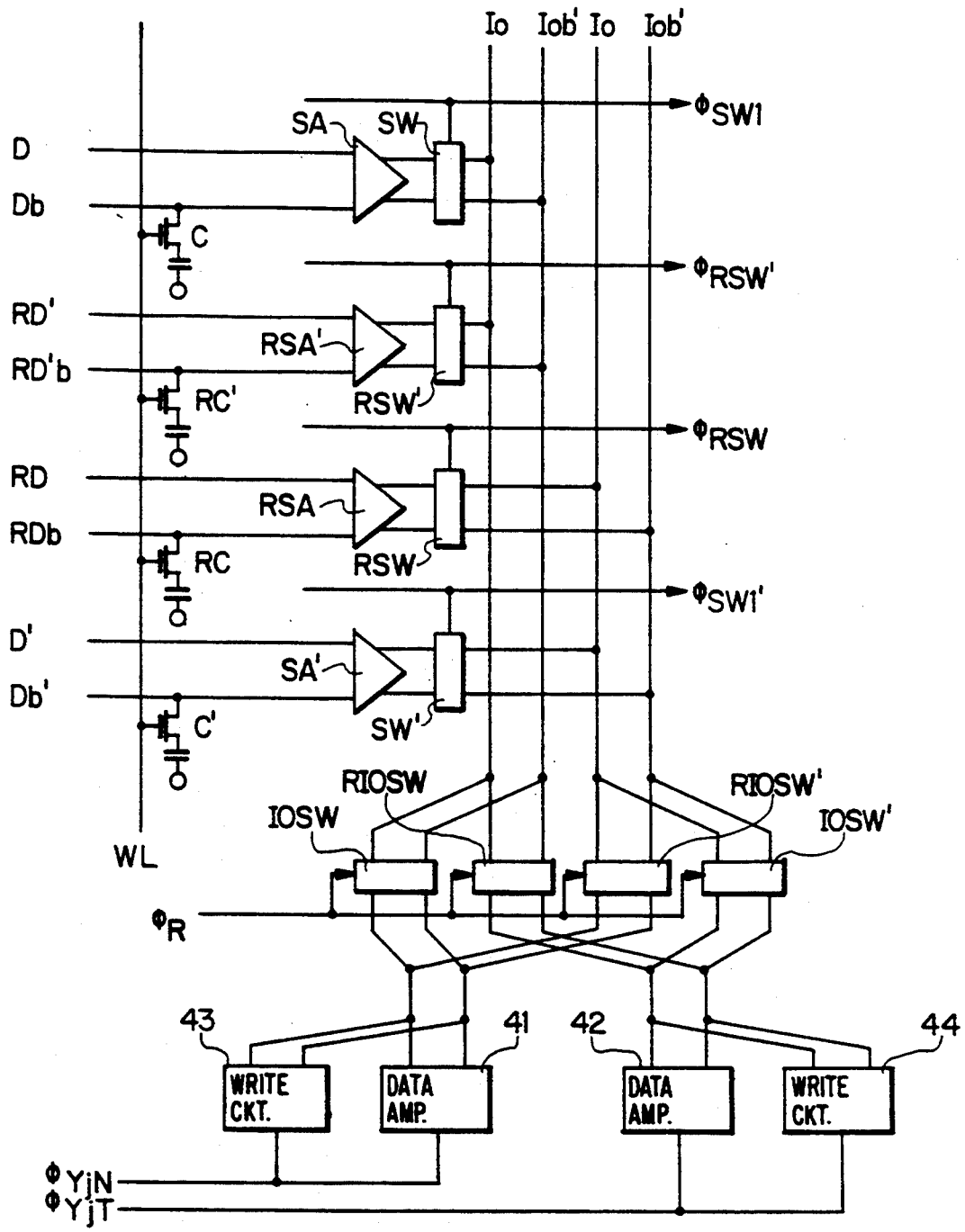
FIG. 2 is another circuit diagram for the semiconductor memory device of the first embodiment of the invention.

Referring to FIG. 1 and FIG. 2 showing a first embodiment of this invention, the semiconductor memory device of this embodiment has a configuration in which the digit lines are subdivided into two groups, and is operated in its normal mode by bringing one of the two column decoders (14 and 14') to an active state in response to input addresses.

In addition, as a countermeasure to the increase in testing time accompanying a high capacity memory, the memory has a parallel test mode which reads simultaneously data of a plurality of cells on the same word lines. In the parallel test mode, data in two memory cells connected to the same word lines in the same cell array are output simultaneously to two pairs of IO lines, IO,IOb and IO',IOb' (see FIG. 2).

A digit line substitution address programming circuit 11 is programmed by melting the fuse of the column address corresponding to a digit line found defective by inspection. This programming circuit 11 receives column addresses Y0 to Yk, and brings $\phi R$ and $\phi RS$ to the active state when it detects that an input address is for a redundant digit line.

The column addresses Y0 to Yk are input to a column address predecoder circuit 12 and column decoder enable signal generating circuit 10 and 10'. The circuit 12 predecodes the column addresses, and outputs predecoded signals Y01 to Yi-li to column decoder circuits 14 and 14'. An address signal Aj and a parallel test signal $\phi T$ are input to an address buffer circuit 15 that detects which one of the two groups of the digit line groups is selected. When $\phi T$ is in the inactive state, $\phi YjT$ is brought to the active state if Aj is a positive logic whereas $\phi YjN$ is brought to the active state if Aj is a negative logic. On the other hand, when $\phi T$ is in the active state, $\phi YjT$ and $\phi YjN$ are invariably in the active state. The circuit 10 receives the column address Yk, an enable inhibit signal $\phi RD$ and $\phi YjN$, and generates column decoder enable signals $\phi E$ and $\phi EB$ (the two signals are in complementary relation) in response to the column address Yk when $\phi YjN$ is in the active state and $\phi RD$ is in the inactive state. The circuit 10' receives the column address Yk, the enable inhibit signal $\phi RD$ and $\phi YjT$, and generates column decoder enable signals $\phi E'$ and $\phi EB'$ under similar conditions.

An inhibit circuit 16 receives $\phi R$ and $\phi T$, and inhibits activation of the column decode enable signals $\phi E$, $\phi EB$ or $\phi E'$, $\phi EB'$ when $\phi T$ is in the active state. Accordingly, at the time of normal operation other than during the parallel test mode, activation of the column decoder enable signal will not be inhibited even if the programming circuit 11 detects that the input column addresses are for redundant digit lines.

The column decoder 14 has the predecoded signals Y01 to Yi-li and the enable signals $\phi E$ and $\phi EB$ as inputs, and brings either one of digit line selection signals $\phi SW1$ to $\phi SWx$ to the active state in response to the predecoded signals when the column decoder enable signals are in the active state. The column decoder 14' has a similar configuration.

Redundant digit line selection signal generating circuits 13 and 13' receive $\phi RS$ generated by the programming circuit 11 and $\phi YjT$ or $\phi YjN$, and genearte selection signals $\phi RSW$ and $\phi RSW'$, respectively, when both $\phi RS$ and $\phi YjN$ are in the active state.

Next, referring to FIG. 2, the configuration of the memory cell array and the IO lines will be described. The digit line group is subdivided into two groups (D, Db and D', Db'), and there exist redundant digit line pairs RD, RDb and RD', RDb' that correspond to the groups, respectively. The digit lines D and Db forming a pair (in reality there are a plurality of such pairs) are in complementary relationships, and a sense amplifier SA for amplifying the potentials of the two digit lines is connected to the pair. The outputs of the sense amplifier SA are connected to a first IO line pair, IO and IOb, via a switching circuit SW whose switching is controlled by a digit line selection signal $\phi SW1$. The redundant digit line pair, RD and RDb, corresponding to the digit line pair, D and Db, is connected to the sense amplifier RSA, and the output of the same amplifier RSA are connected to a second IO line pair, IO' and IOb', via a switching circuit RSW whose switching is controlled by the redundant digit line selection signal $\phi RSW$. The configuration of the other digit line pair, D' and Db', and the corresponding redundant digit line pair, RD' and RDb', is similar to the above. What is important here is the fact that the IO line pair connected to the digit line pair and the IO line pair connected to the redundant digit line pair are different IO line pairs.

The first IO line pair, IO and IOb, and the second IO line pair, IO' and IOb', are connected to IOSW, RIOSW, IOSW' and RIOSW' that constitution an IO line pair switching circuit, and the switching of the IO line pair switching circuit is controlled by the signal $\phi R$. When $\phi R$ is in the inactive state, namely, when the normal digit lines are selected, IOSW and IOSW' go to the on-state, whereas when $\phi R$ is in the active state, namely, when the redundant digit lines are selected, RIOSW and RIOSW' go to the on-state. The outputs of the IO line pair switching circuit are connected to data amplifier circuits 41 and 42, and write circuits 43 and 44. The data amplifier 41 and write circuit 43 operate when $\phi YjN$ is in the active state, and the data amplifier circuit 42 and the write circuit 44 operate when $\phi YjT$ is in the active state.

Figure 3:
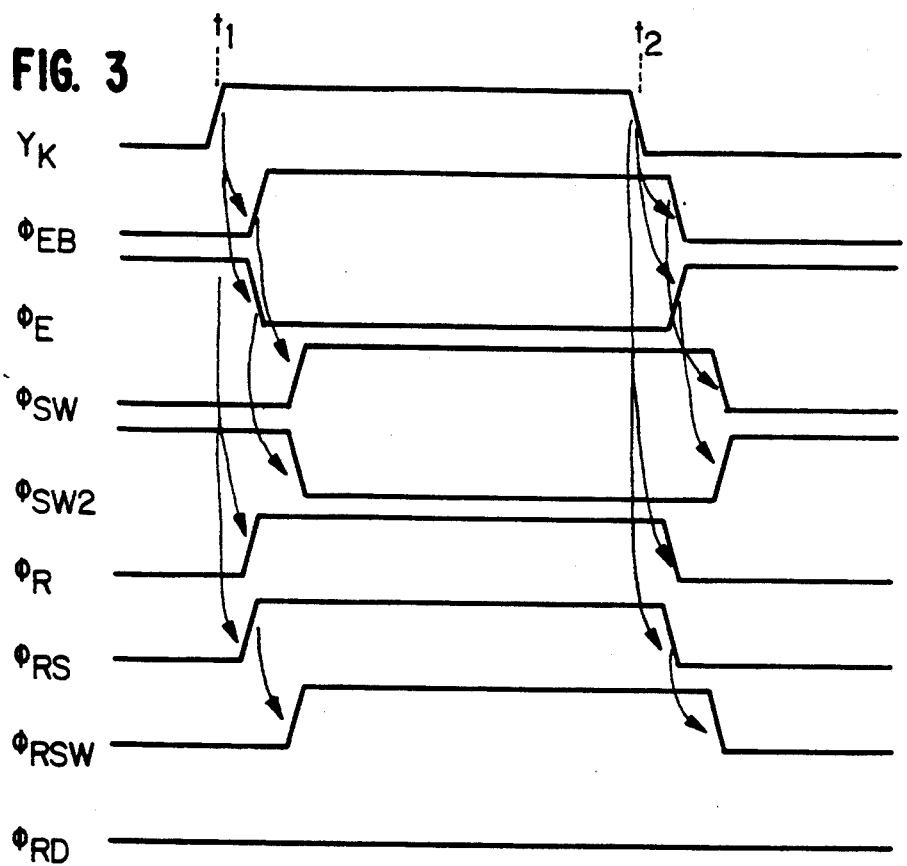
FIG. 3 is a waveform diagram for describing the operation of the semiconductor memory device shown in FIG. 1 and FIG. 2.
Figure 4:
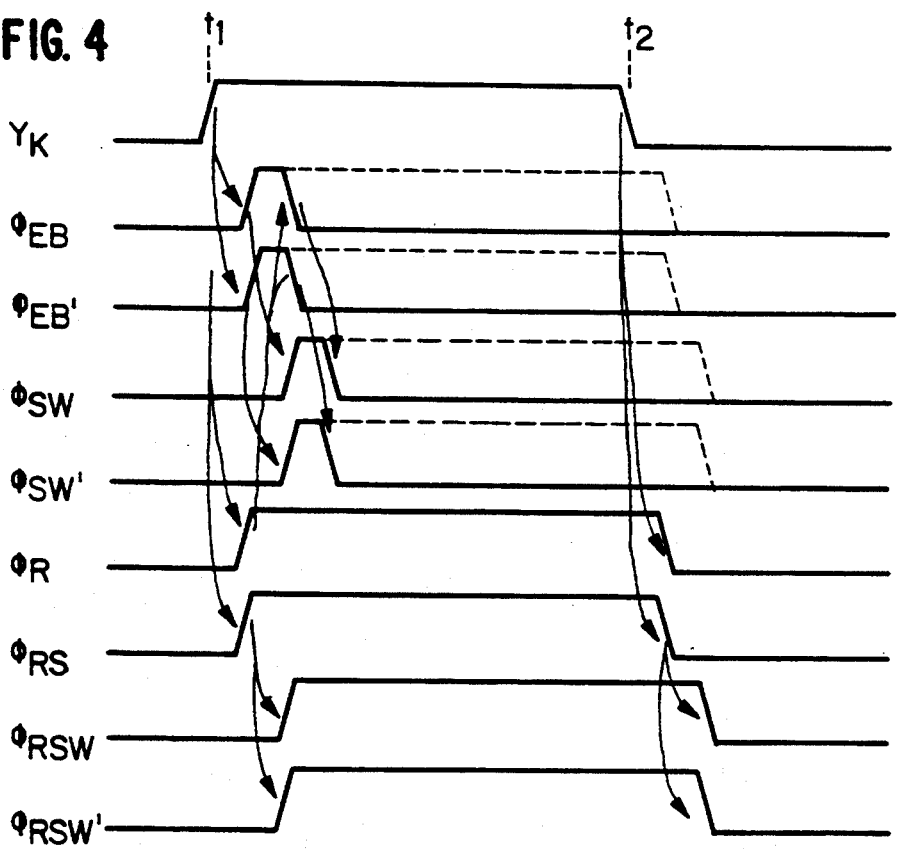
FIG. 4 is another waveform diagram for describing the operation of the semiconductor memory device shown in FIG. 1 and FIG. 2.

Next, referring also to FIG. 3 which is a timing diagram when redundant digit lines are selected and FIG. 4, the operation of this embodiment will be described. First, the normal operation mode will be described. At the time of the normal operation, the parallel test signal $\phi T$ stays in the inactive state all the time and the inhibit circuit 16 always outputs $\phi RD$ at the low level, so that activation of the enable signals $\phi E$, $\phi EB$ or $\phi E'$, $\phi EB'$ will not be inhibited. In other words, even when the redundant digit lines are used, activation of the column decoder enable signals will not be inhibited.

Further, since $\phi T$ is in the inactive state, the address buffer circuit 15 brings either one of $\phi YjT$ and $\phi YjN$ to the active state in response to the address signal Aj. In this embodiment, the case of $\phi YjN$ being in the active state will be described as an example. The circuit 10 will go to the active state in response to $\phi YjN$ in the active state. Accordingly, the enable signals $\phi E$ and $\phi EB$ go to the active state, and as a result, the column decoder circuit 14 goes to the active state.

When the input column addresses Y0 to Yk are for the normal digit lines, the circuit 11 keeps $\phi R$ and $\phi RS$ at the low level. Consequently, the circuit 13 is not activated, and the selection signal $\phi RSW$ also maintains the low level. The column decoder circuit 14 brings either one of the selection signals $\phi SW1$ to $\phi SWx$ (for example $\phi SW1$) to the active state. As $\phi SW1$ goes to the active state, the switching circuit SW (see FIG. 2) goes to the on-state, and the data on the digit line pair, D and Db, are amplified by the sense amplifier SA to be output to the IO line pair, IO and IOb. Since $\phi R$ is at the low level at this time, IOSW and IOSW' of the IO line pair switching circuit go to the on-state, and the first IO line pair, IO and IOb, is connected by $\phi$YjN to the data amplifier circuit 41 and the write circuit 43 that are in the active state.

On the other hand, when the input column address Y0 to Yk are for redundant digit lines (see the time t1 in FIG. 3), the circuit 11 brings $\phi$R and $\phi$RS to the high level. Accordingly, the circuit 13 is activated, and the selection signal $\phi$RSW is brought to the high level. Now, when $\phi$T is in the inactive state, the inhibit circuit 16 will not inhibit the activation of the column decoder enable signal, as mentioned above. Accordingly, the column decoder circuit 14 brings either one of the digit line selection signals $\phi$SW1 to $\phi$SWx (for example, $\phi$SW2) to the active state in response to the changed predecoded signals.

As the selection signal $\phi$RSW goes to the active state, the switching circuit RSW (see FIG. 2) goes to the on-state, data on the digit line pair, RD and RDb, are amplified by the sense amplifier RSA, and are output to the second line pair, IO' and IOb'. Since $\phi$R is at the high level at this time, RIOSW' of the IO line pair switching circuit goes to the on-state and the second IO line pair, IO' and IOb', is in the active state in response to $\phi$YjN being in the active state.

On the other hand, the first IO line pair, IO and IOb, receives data on a digit line pair (not shown) corresponding to the digit line selection signal $\phi$SW2, and is connected to the data amplifier circuit 42 and the write circuit 44 via RIOSW that is in the on-state, of the IO line pair switching circuit. Since, however, $\phi$YjT is in the inactive state, the data amplifier circuit 42 and the write circuit 44 will not operate.

As is clear from the above operations, since the IO line pair that is connected to the digit line pair is different from the IO line pair that is connected to the redundant digit line pair, in this embodiment, even when the redundant digit line pair is substituted for the digit line pair, it is possible to perform the redundancy operation by the mere substitution of these IO line pairs. Accordingly, there is absolutely no possibility of having multiple selections on the same IO line pair as is the case with the conventional device; and there is no need for the operation, at the time of switching from the redundant digit lines to the normal digit lines, of releasing the inhibition on the activation of the column decoder enable signal and activating the column decoder as is required in the conventional case, enabling thereby to increase the operating speed. In the present embodiment, the access speed to the column address was increased by 10 to 20%. Moreover, since it is possible to use as the second pair of IO lines the IO line pair which has been used conventionally in the parallel test that will be described next, this invention becomes applicable without increasing the occupation area of the device.

Next, referring to FIG. 4, the operation at the time of parallel test will be described. Since the parallel test signal $\phi$T is in the active state at the time of parallel test, and since the inhibit circuit 16 brings $\phi$RD to the active state when $\phi$R is in the active state, the circuit 16 inhibits the column decoder enable signal generating circuits 10 and 10' to activate the column decoder enable signals $\phi$E, $\phi$EB or $\phi$E', $\phi$EB'. In addition, since $\phi$T is in the active state, the address buffer circuit 15 always brings both $\phi$YjT and $\phi$YjN to the active state. In other words, at the parallel test both the digit line selection signal and the redundant digit line selection signal are generated simultaneously.

When the column addresses Y0 to Yk are for the normal digit lines, the circuit 11 maintains $\phi$R and $\phi$RS at the low level. Accordingly, since the inhibit circuit 16 brings $\phi$RD to the inactive state, it will not inhibit the circuits 10 and 10' to activate the column decoder enable signals $\phi$E, $\phi$EB or $\phi$E', $\phi$EB'.

Moreover, the circuits 13 and 13' are not activated, and the selection signals $\phi$RSW and $\phi$RSW' will also be maintained at the low level. The column decoder circuits 14 and 14' activate one each out of the digit line selection signals $\phi$SW1 to $\phi$SWx and $\phi$SW1' to $\phi$SWx' (for example, $\phi$SW1 and $\phi$SW1') in response to the predecorded signals. As both $\phi$SW1 and $\phi$SW1' go to the active state, the switching circuits SW and SW' (see FIG. 2) are brought to the on-state, and the data on the digit line pair, D and Db, is output to the first IO line pair, IO and IOb, and at the same time the data on the digit line pair D' and Db', is output to the second IO line pair IO' and IOb'. Since both OYjT and OYjN are in the active state, the amplifier circuits 41 and 42, and the write circuits 43 and 44 all go to the active state. Further, since $\phi$R is at the low level, IOSW and IOSW' of the IO line pair switching circuit go to the on-state and the first IO line pair, IO and IOb, is connected to the data amplifier circuit 41 and the write circuit 43, and the second IO line pair, IO' and IOb', is connected to the data amplifier 42 and the write circuit 44. With the above operation, a simultaneous read/write operation of two data becomes possible.

On the other hand, when the input column addresses Y0 to Yk are for redundant digit lines (see the time t1 in FIG. 4), the circuit 11 brings $\phi$R and $\phi$RS to the high level. Accordingly, the circuit 13 and 13' are activated, and the selection signals $\phi$RSW and $\phi$RSW' go to the high level. In addition, since the inhibit circuit 16 activates $\phi$RD, the circuit 10 and 10' are inhibited to activate the column decoder enable signals $\phi$E, $\phi$EB and $\phi$E', $\phi$EB'. Accordingly, the column decoder circuits 14 and 14' will not generate activated digit line selection signals.

As the selection signals $\phi$RSW and $\phi$RSW' go to the active state, both switching circuits RSW and RSW'(see FIG. 2) go to the on-state, the data on the digit line pair, RD and RDb, is output to the second IO line pair, IO' and IOb', and the data on the digit line pair, RD' and RDb', is output to the first IO line pair, IO and IOb. Since OR is at the high level at this time, RIOSW and RIOSW' of the IO line pair switching circuit go to the on-state and the second IO line pair, IO' and IOb', is connected to the data amplifier circuit 41 and the write circuit 43 that are in the active state, and the first IO line pair, IO and IOb, is connected to the data amplifier circuit 41 and the write circuit 43 that are in the active state.

Figure 5:
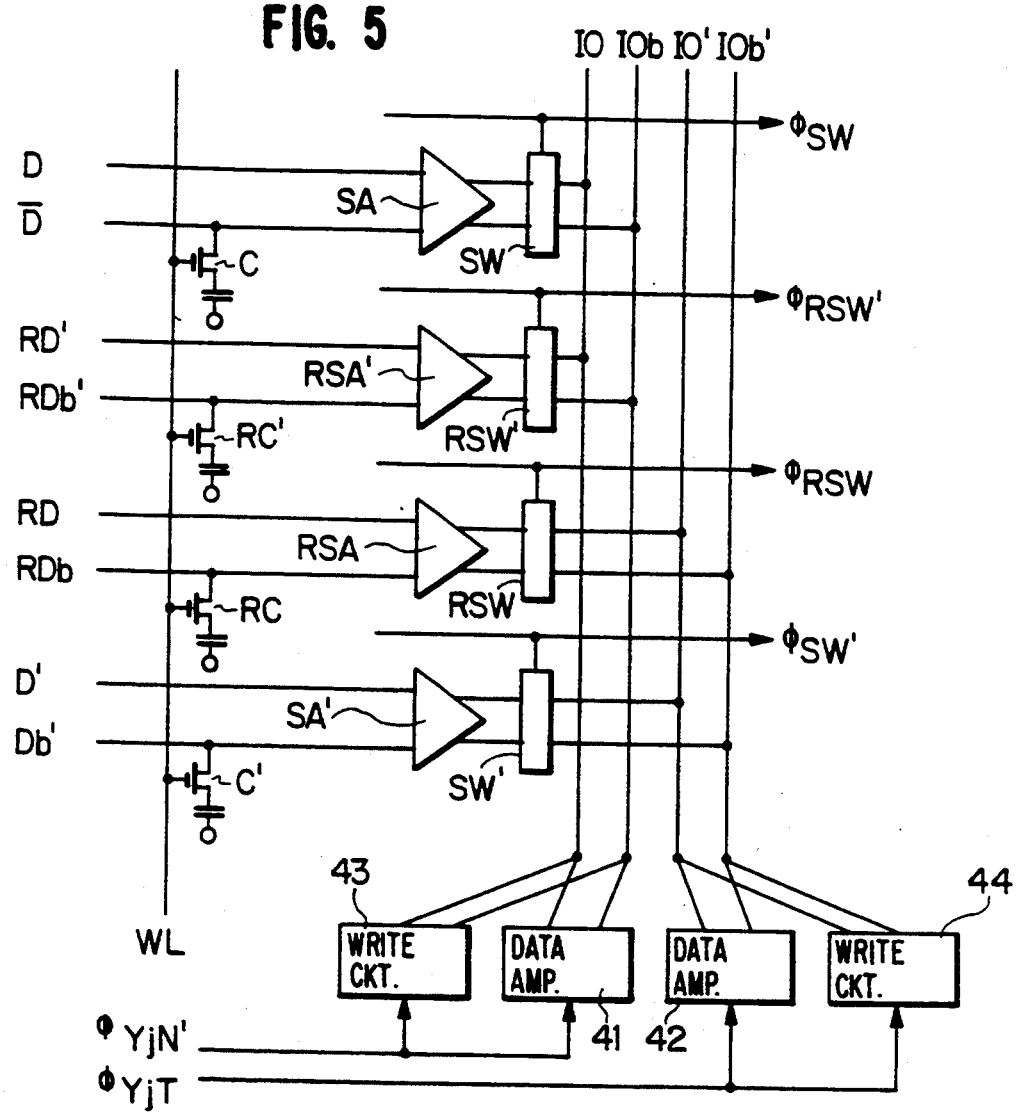
FIG. 5 is a circuit diagram for the semiconductor memory device which is a second embodiment of the invention.

Next, referring to FIG. 5, the second embodiment of this invention is the same as the first embodiment except that IOSW, RIOSW, IOSW' and RIOSW' that constitute the IO line pair switching circuits in the first embodiment are absent, and that signals for controlling the data amplifier circuit 41 and 42 and the write circuit 43 and 44 are $\phi$YjT' and $\phi$YjN'. Therefore, its detailed description will be omitted.

Figure 6:
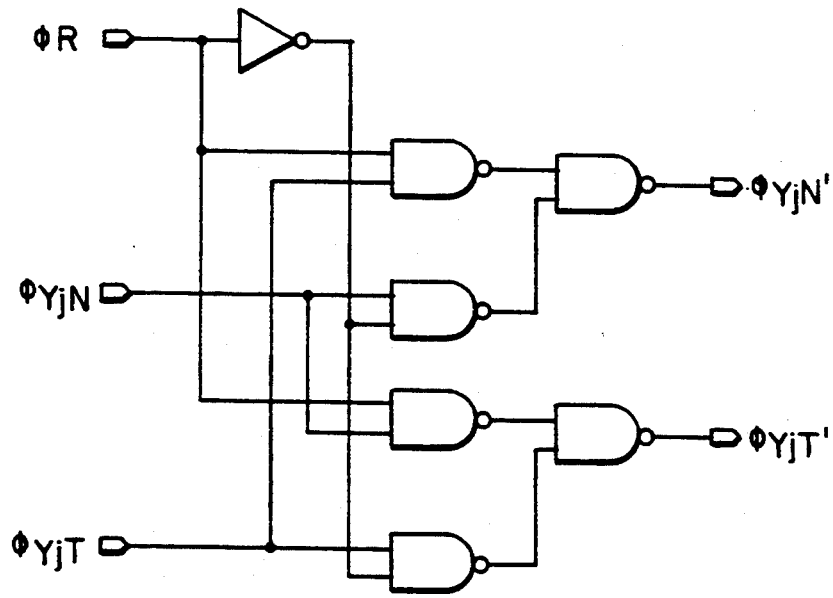
FIG. 6 is another circuit diagram for the semiconductor memory device of the second embodiment of the invention.

The generating circuit of $\phi$YjT' and $\phi$YjN' is shown in FIG. 6. In the following, in which the group of digit lines D and Db of the digit line group is selected, the case of $\phi$YjN being at the high level, will be described as an example.

When the normal digit lines are in use, $\phi YjT'$ and $\phi YjN'$ are identical to $\phi YjT$ and $\phi YjN$ since $\phi R$ is at the low level. As $\phi YjN'$ goes to the active level, the first IO line pair, IO and IOb, connected to the digit lines D and Db is connected to the data amplifier circuit 41 and the write circuit 43 that are in the active state.

On the other hand, when the redundant digit lines are in use, $\phi YjT'$ and $\phi YjN'$ are identical to $\phi YjN$ and $\phi YjT$ since $\phi R$ is at the high level. In other words, the logical values of $\phi YjT$ and $\phi YjN$ are output inverted. Accordingly, $\phi YjT'$ goes to the active state, and the second IO line pair, IO' and IOb', connected to the redundant digit line pair, RD and RDb, is connected to the data amplifier circuit 42 and the write circuit 44 that are in the active state.

As is clear from the above description, this embodiment makes it possible to execute the selection of the two IO line pairs identical to that of the first embodiment without the use of the IO line pair switching circuit of the first embodiment by changing the activity of the group of the data amplifier circuit and the write circuit (that is, whether 41 and 43 are to be activated or 42 and 44 are to be activated). Accordingly, this invention has the effect of eliminating the need for the switching.

I claim:

1. A semiconductor memory device comprising:
at least one digit line pair, at least one redundant digit line pair corresponding to said at least one digit line pair, first input/output lines connected to said at least one digit line pair via a respective sense amplifier and switch, second input/output lines connected to said at least one redundant digit line pair via a sense amplifier and switch, and selective amplifier means for amplifying said second input/output lines when said at least one redundant digit line pair is selected, wherein said selective amplifier means includes a switching circuit which connects said second input/output lines to active amplifier circuits in response to a redundancy detection signal.

2. A semiconductor memory device comprising:
at least one digit line pair, at least one redundant digit line pair corresponding to said at least one digit line pair, first input/output lines connected to said at least one digit line pair via a respective sense amplifier and switch, second input/output lines connected to said at least one redundant digit line pair via a sense amplifier and switch, and selective amplifier means for amplifying said second input/output lines when said at least one redundant digit line pair is selected, wherein said selective amplifier means includes a first amplifier circuit connected to said first input/output lines, a second amplifier circuit connected to said second input/output lines, and means for activating said second amplifier circuit when said at least one redundant digit line pair is selected.

3. A semiconductor memory device comprising:
a decoder circuit which generates a digit line selection signal that selects predetermined digit lines in response to input addresses, a discrimination circuit which discriminates whether redundant digit lines are selected based on said input addresses, a circuit which generates a redundant digit line selection signal that selects said redundant digit lines in response to a discrimination signal of said discrimination circuit, first input/output lines connected respectively to the digit lines via a group of switches whose activation is controlled in response to said digit line selection signal, second input/output lines connected to the redundant digit lines via a switch whose activation is controlled in response to said redundant digit line selection signal, and selective amplifier means for selectively amplifying said second input/output lines in response to said discrimination signal.

4. A semiconductor memory device as claimed in 3, wherein said selective amplifier means includes a switching circuit which connects said second input/output lines to amplifier circuits in active state in response to a redundancy detection signal.

5. A semiconductor memory device as claimed in claim 3, wherein said selective amplifier means includes a first amplifier circuit connected to said first input/output lines, a second amplifier circuit connected to second input/output lines, and means for activating said second amplifier circuit when said redundant digit lines are selected.

6. A semiconductor memory device comprising:
first and second input/output line pairs, a first digit line pair connected to said first input/output line pair, a first redundant digit line pair connected to said second input/output lines, a second digit line pair connected to said second input/output line pair, a second redundant digit lines connected to said first input/output line pair, and selective amplifier means for amplifying said second input/output line pair when said first redundant digit line pair is selected and amplifying said first input/output line pair when said second redundant digit line pair are selected.

7. A semiconductor memory device as claimed in claim 6 further comprising means for amplifying both of said first and second input/output line pairs even when said first and second redundant digit line pairs are selected at the time of parallel testing.

8. A semiconductor memory device comprising a first input/output line pair, a first digit line pair coupled to a first memory cell, a first switch provided between said first input/output line and said first digit line pair and, when activated, forming an electrical path therebetween, a second input/output line pair, a second digit line coupled to a second memory cell, a second switch provided between said second input/output line pair and said second digit line and, when activated, forming an electrical path therebetween, a first redundant digit line pair coupled to a first redundant memory cell, a third switch provided between said first redundant digit line pair and said second input/output line and, when activated, forming an electrical path therebetween, a second redundant digit line pair coupled to a second redundant memory cell, a fourth switch provided between said second redundant digit line pair and said first input/output line and, when activated, forming an electrical path therebetween, and a switch control circuit responding to first information indicative of said first memory cell being defective to activate said third switch while deactivating said fourth switch and further responding to second information indicative of said second memory cell being defective to activate said fourth switch while deactivating said third switch.

* * * * *

UNITED STATES PATENT AND TRADEMARK OFFICE
CERTIFICATE OF CORRECTION

PATENT NO. : 5,424,987
DATED : June 13, 1995
INVENTOR(S) : Yoshinori MATSUI

It is certified that error appears in the above-indentified patent and that said Letters Patent is hereby corrected as shown below:

Col. 3, line 60, delete "genearte", insert --generate--

Col. 6, line 13, delete "predecorded", insert --predecoded--

Col. 6, line 47, delete "OR", insert --$\phi$R--

Col. 8, line 27, delete "lines", insert --line pair-- claim 7, line 4,

UNITED STATES PATENT AND TRADEMARK OFFICE
CERTIFICATE OF CORRECTION

PATENT NO. : 5,424,987
DATED : June 13, 1995
INVENTOR(S) : Yoshinori MATSUI

It is certified that error appears in the above-indentified patent and that said Letters Patent is hereby corrected as shown below:

Col. 8, line 49, after "line", insert --pair--

Col. 8, line 54, after "output line", insert --pair-- claim 9, line 8,

Col. 8, line 59, after "line", insert --pair--

Signed and Sealed this

Third Day of October, 1995

*Attest:*

BRUCE LEHMAN

*Attesting Officer*     *Commissioner of Patents and Trademarks*